(12) United States Patent
Jeong et al.

(10) Patent No.: US 8,043,710 B2
(45) Date of Patent: Oct. 25, 2011

(54) ULTRA-HYDROPHILIC AND ANTIBACTERIAL THIN FILM COATED METAL PRODUCT, AND IT'S MANUFACTURING METHOD

(75) Inventors: Young-Man Jeong, Gimhae-shi (KR); Jung-Geun Oh, Changwon-shi (KR); Hyun-Woo Jun, Changwon-shi (KR); Su-Won Lee, Changwon-shi (KR); Deok-Hyun Youn, Anyang-shi (KR)

(73) Assignee: LG Electronics Inc., Seoul (KR)

( * ) Notice: Subject to any disclaimer, the term of this patent is extended or adjusted under 35 U.S.C. 154(b) by 965 days.

(21) Appl. No.: 11/547,631

(22) PCT Filed: Nov. 6, 2004

(86) PCT No.: PCT/KR2004/002870
§ 371 (c)(1),
(2), (4) Date: Nov. 30, 2007

(87) PCT Pub. No.: WO2005/098076
PCT Pub. Date: Oct. 20, 2005

(65) Prior Publication Data
US 2008/0193745 A1    Aug. 14, 2008

(30) Foreign Application Priority Data
Apr. 6, 2004 (JP) .......................... 10-2004-0023446

(51) Int. Cl.
*B32B 15/04* (2006.01)
*B32B 9/00* (2006.01)

(52) U.S. Cl. ........ 428/457; 428/469; 428/472; 428/470; 428/689; 428/697; 428/699; 428/701; 428/702

(58) Field of Classification Search .................. 428/457, 428/469, 472, 470, 689, 697, 699, 701, 702
See application file for complete search history.

(56) References Cited

U.S. PATENT DOCUMENTS
4,737,415 A    4/1988   Ichijo et al.
5,190,807 A    3/1993   Kimock et al.
(Continued)

FOREIGN PATENT DOCUMENTS
CN       1420207 A    5/2003
(Continued)

OTHER PUBLICATIONS da Cruz et al., "Properties of Titanium Oxide Films Obtained by PECVD," Surface Coatings & Technology, vol. 126, p. 12-130, Elsevier (2000).

*Primary Examiner* — Gwendolyn Blackwell
(74) *Attorney, Agent, or Firm* — Birch, Stewart, Kolasch & Birch, LLP

(57) ABSTRACT

The present invention discloses a ultra-hydrophilic and antibacterial thin film coated metal product, and its manufacturing method. In order to easily produce an air conditioning metal material having excellent hydrophilic performance, aging property, corrosion resistance and antibacterial property on an industrial production scale without a special preprocess or postprocess, an anticorrosive thin film is selectively formed on both surfaces of a metal substrate sheet, and an ultra-hydrophilic and antibacterial Ti—(Ag, Cu and/or Co)—O—C group compound thin film is coated on both surfaces of the metal substrate sheet on which the anticorrosive thin film has been or not been formed. The metal substrate sheet is mechanically processed into a target shape.

11 Claims, 11 Drawing Sheets

U.S. PATENT DOCUMENTS

| | | | |
|---|---|---|---|
| 5,702,770 | A | 12/1997 | Martin |
| 6,007,875 | A | 12/1999 | Grunwald et al. |
| 6,027,766 | A | 2/2000 | Greenberg et al. |
| 6,071,606 | A * | 6/2000 | Yamazaki et al. ............ 428/325 |
| 6,074,981 | A | 6/2000 | Tada et al. |
| 6,297,175 | B1 | 10/2001 | Iyer |
| 6,472,088 | B2 | 10/2002 | Nakamura et al. |
| 6,673,433 | B1 | 1/2004 | Saeki et al. |
| 6,749,813 | B1 | 6/2004 | David et al. |
| 6,835,688 | B2 | 12/2004 | Morikawa et al. |
| 6,911,139 | B2 | 6/2005 | Heimann et al. |
| 2001/0026859 | A1 | 10/2001 | Nakamura et al. |
| 2002/0041967 | A1 | 4/2002 | Nakamura et al. |
| 2002/0098345 | A1 | 7/2002 | Kamo et al. |
| 2002/0155299 | A1 | 10/2002 | Harris et al. |
| 2002/0169076 | A1 | 11/2002 | Takeshi et al. |
| 2003/0166765 | A1 * | 9/2003 | Sugihara ....................... 524/497 |
| 2003/0209290 | A1 | 11/2003 | Heimann et al. |
| 2005/0003644 | A1 | 1/2005 | Remington, Jr. et al. |
| 2005/0129935 | A1 | 6/2005 | Kunitake et al. |
| 2005/0170716 | A1 | 8/2005 | Ylitalo |
| 2005/0266248 | A1 * | 12/2005 | Millero et al. ............. 428/411.1 |
| 2007/0040278 | A1 | 2/2007 | Furuya |
| 2007/0186643 | A1 | 8/2007 | Speldrich et al. |
| 2010/0028663 | A1 | 2/2010 | Jeong et al. |

FOREIGN PATENT DOCUMENTS

| | | |
|---|---|---|
| EP | 0 857 518 A1 | 8/1998 |
| GB | 2 350 841 A | 12/2000 |
| JP | 8-49085 A | 2/1996 |
| JP | 10-317178 A | 12/1998 |
| JP | 2001-280879 A | 10/2001 |
| KR | 2002-0083273 A | 11/2002 |
| KR | 2002-0088029 A | 11/2002 |
| KR | 2003-0030755 | 4/2003 |
| KR | 2003-0030755 A | 4/2003 |
| WO | WO-99/28530 A1 | 6/1999 |
| WO | WO-2004/014986 A1 | 2/2004 |

* cited by examiner

_US 8,043,710 B2_

ULTRA-HYDROPHILIC AND ANTIBACTERIAL THIN FILM COATED METAL PRODUCT, AND IT'S MANUFACTURING METHOD

TECHNICAL FIELD

The present invention relates to an ultra-hydrophilic and antibacterial thin film coated metal product, and its manufacturing method.

BACKGROUND ART

Metal materials having hydrophilic surface layers on their surfaces have been efficiently used in the whole industrial fields, which will now be explained by using a heat exchanger as an example.

A heat exchanger exchanging heat by making two fluids having different temperatures directly or indirectly contact each other has been widely used in various industrial fields, especially for heating, air conditioning, power generation, waste heat recovery and chemical processes.

An air conditioning heat exchanger forms a fin that is an enlarged surface at the air side to improve heat transmission. When the air having humidity passes through the fin in the heat exchange operation, heat transmission occurs by low temperature refrigerants supplied into a tube. When a temperature of the surface of the fin is equal to or lower than a dew point temperature of the air having humidity, droplets are formed on the surface of the heat exchanger to intercept flow of the air, which increases a pressure drop that is a pressure difference between the inlet and outlet of the heat exchanger. Accordingly, power of a fan must be increased to supply the same flux, which results in large power consumption.

In order to solve the above problem, as disclosed in Japanese Laid-Open Patent Application 61-8598, flow of condensed water formed on a surface of a fin of a heat exchanger is improved by performing an anti-corrosive process on an aluminum sheet of the fin by using $Cr^{+6}$ to improve corrosion resistance, and performing a silicate-group coating process thereon to give hydrophilicity, which is called a pre-coated material (PCM).

The PCM basically requires $Cr^{+6}$ to obtain corrosion resistance. However, $Cr^{+6}$ will be prevented since 2006 due to environmental problems. There are thus increasing demands for a material substituting for $Cr^{+6}$. Until now, $Cr^{+3}$ or resin type has been suggested. In the preparation of the PCM, tetrachloroethane (TCE) inevitably used to wash aluminum also causes environmental contamination. In addition, the PCM showing excellent hydrophilic performance at an initial stage gradually loses the hydrophilic property, namely, has an aging characteristic. Recently, chemical products have been mostly used as materials for wallpaper. The silicate material for giving hydrophilicity is volatilized and chemically coupled with the wall paper, thereby discoloring the wall paper. Also, the volatilized materials displease people.

Continuous attempts have been made to satisfy various demands by forming a functional surface layer (for example, hydrophilicity or hydrophobicity) on the existing material. Exemplary methods for forming the functional surface layer include 1) depositing the functional surface layer on the existing material, and 2) giving new physical and chemical properties by improving the surface film of the existing material.

However, in the latter, as the time elapses, the surface property is changed and returns to the original property. For example, in the case that a metal such as aluminum is processed according to an ion beam assisted reaction process, hydrophilicity of the surface of the metal is improved. It is because a natural oxide film is etched on the surface of the aluminum and the functional film is formed thereon. As the time elapses, an oxide film is naturally grown on the surface of the aluminum. As a result, hydrophilicity improvement effects obtained by etching the natural oxide film are deteriorated. The functional film formed on the surface of the aluminum is made of an extremely thin layer (<a few nm) having very low mechanical resistance to environmental variations (water, temperature, etc.) by time. Accordingly, the improved hydrophilic property is reduced and returns to the original surface property.

In order to solve the foregoing problem, efforts have been continuously made to form on a metal material a hydrophilic or hydrophobic functional surface layer that can maintain a physically chemically stable state.

For example, as suggested in Japanese Laid-Open Patent Application 2001-280879, in a heat exchanger mounting a fin made of a conductive metal material on a metal tube that is a refrigerant passage, compound vapor containing Ti that is raw gas is supplied to flow in parallel to the surface of the fin of the heat exchanger in the air. Therefore, the heat exchanger coating the Ti dioxide thin film on the surface of the fin is manufactured according to a plasma CVD technology. The above patent application teaches that the heat exchanger can obtain excellent hydrophilic, antibacterial and deodorizing properties.

However, in a state where the fin is mounted on the tube to compose the heat exchanger, the Ti dioxide thin film is deposited on the fin of the heat exchanger. Thus, the Ti dioxide thin film cannot be uniformly deposited on the whole surface of the fin, which deteriorates hydrophilic and aging properties. Furthermore, productivity for direct application to the industrial production is not attained.

DISCLOSURE OF THE INVENTION

The present invention is achieved to solve the above problems. An object of the present invention is to provide a ultra-hydrophilic and antibacterial thin film coated metal product having excellent hydrophilic performance, aging property, corrosion resistance and antibacterial property, and its manufacturing method.

Another object of the present invention is to easily produce an ultra-hydrophilic thin film on an industrial production scale, by forming an anticorrosive, ultra-hydrophilic and/or antibacterial thin film on a sheet-shaped metal substrate and mechanically processing the metal substrate into a target shape.

Yet another object of the present invention is to uniformly form an ultra-hydrophilic and/or antibacterial thin film on both surfaces of a sheet-shaped metal substrate.

Yet another object of the present invention is to form an antibacterial thin film on an air conditioning metal material without requiring a special preprocess or postprocess.

In order to achieve the above-described objects of the invention, there is provided an ultra-hydrophilic and antibacterial thin film coated metal product, which is manufactured by coating an ultra-hydrophilic and antibacterial Ti—(Ag, Cu and/or Co) group compound thin film on both surfaces of a substrate. The compound thin film is one of a Ti—Ag—O group compound thin film, a Ti—Cu—O group compound thin film, a Ti—Co—O group compound thin film, and a Ti—Ag—Cu—Co—O group compound thin film. The compound thin film contains 15 to 22 atomic % of Ti, 3 to 10 atomic % of Ag, 3 to 10 atomic % of Cu, 3 to 10 atomic % of Co and 45 to 65 atomic % of O, and further contains C and/or H. In addition, the compound thin film contains 15 to 22 atomic % of Ti, 3 to 10 atomic % of Ag and/or 3 to 10 atomic % of Cu, 3 to 10 atomic % of Co and 45 to 65 atomic % of O, and further contains 20 to 25 atomic % of C and/or 20 to 25 atomic % of H. An anticorrosive thin film is further coated between the substrate and the Ti—(Ag, Cu and/or Co) group compound thin film. The anticorrosive thin film is a Si—O group compound thin film.

The anticorrosive thin film contains 20 to 25 atomic % of Si and 45 to 65 atomic % of O. The thin films are coated by using plasma. The total thickness of the thin films ranges from 1 to 200 nm. The metal substrate is an aluminum substrate. The thin film coated metal sheet can be mechanically processed into a target shape.

There is also provided a manufacturing method of a ultra-hydrophilic and antibacterial thin film coated metal product, which continuously coats a ultra-hydrophilic and antibacterial Ti—(Ag, Cu and/or Co) group compound thin film on both surfaces of a continuously-supplied sheet-shaped metal substrate in a vacuum chamber by using plasma, and mechanically processes the thin film coated sheet into a target shape. The compound thin film is one of a Ti—Ag—O group compound thin film, a Ti—Cu—O group compound thin film, a Ti—Co—O group compound thin film, and a Ti—Ag—Cu—Co—O group compound thin film. The compound thin film further contains C and/or H.

The coating process of the compound thin film is performed by injecting reactive gas, gas-phase Ti precursor, gas-phase Ag precursor, gas-phase Co precursor and/or gas-phase Cu precursor, and carrier gas into the vacuum chamber. The injection amount of the gas-phase Ag precursor and/or the gas-phase Cu precursor and the carrier gas ranges from 100 to 200 sccm, respectively. The gas injection ratio satisfies carrier gas:gas-phase Ag precursor and/or gas-phase Cu precursor=1:1 to 1:2.

Preferably, the manufacturing method continuously coats an anticorrosive thin film on both surfaces of the continuously-supplied sheet-shaped metal substrate in the vacuum chamber by using plasma before continuously coating the Ti—(Ag, Cu and/or Co) group compound thin film. The anticorrosive thin film is a Si—O group compound thin film. The coating process of the anticorrosive thin film is performed by injecting reactive gas, gas-phase Si precursor and carrier gas into the vacuum chamber. The injection ratio of the reactive gas and the carrier gas ranges from 1:10 to 1:20. In addition, the injection ratio of the carrier gas and the gas-phase Si precursor ranges from 1:1 to 1:2.

Preferably, the reactive gas is air or $O_2$, and the carrier gas is at least one selected from the group consisting of He, $N_2$ and Ar. The total thickness of the anticorrosive thin film and the Ti compound thin film ranges from 1 to 200 nm.

The metal substrate is an aluminum substrate. The thin film coated metal product is a fin for a heat exchanger.

BRIEF DESCRIPTION OF THE DRAWINGS

The present invention will become better understood with reference to the accompanying drawings which are given only by way of illustration and thus are not limitative of the present invention, wherein.

BEST MODE FOR CARRYING OUT THE INVENTION

An ultra-hydrophilic and antibacterial thin film coated metal product, and its manufacturing method in accordance with the present invention will now be described in detail with reference to the accompanying drawings.

Figure 1:
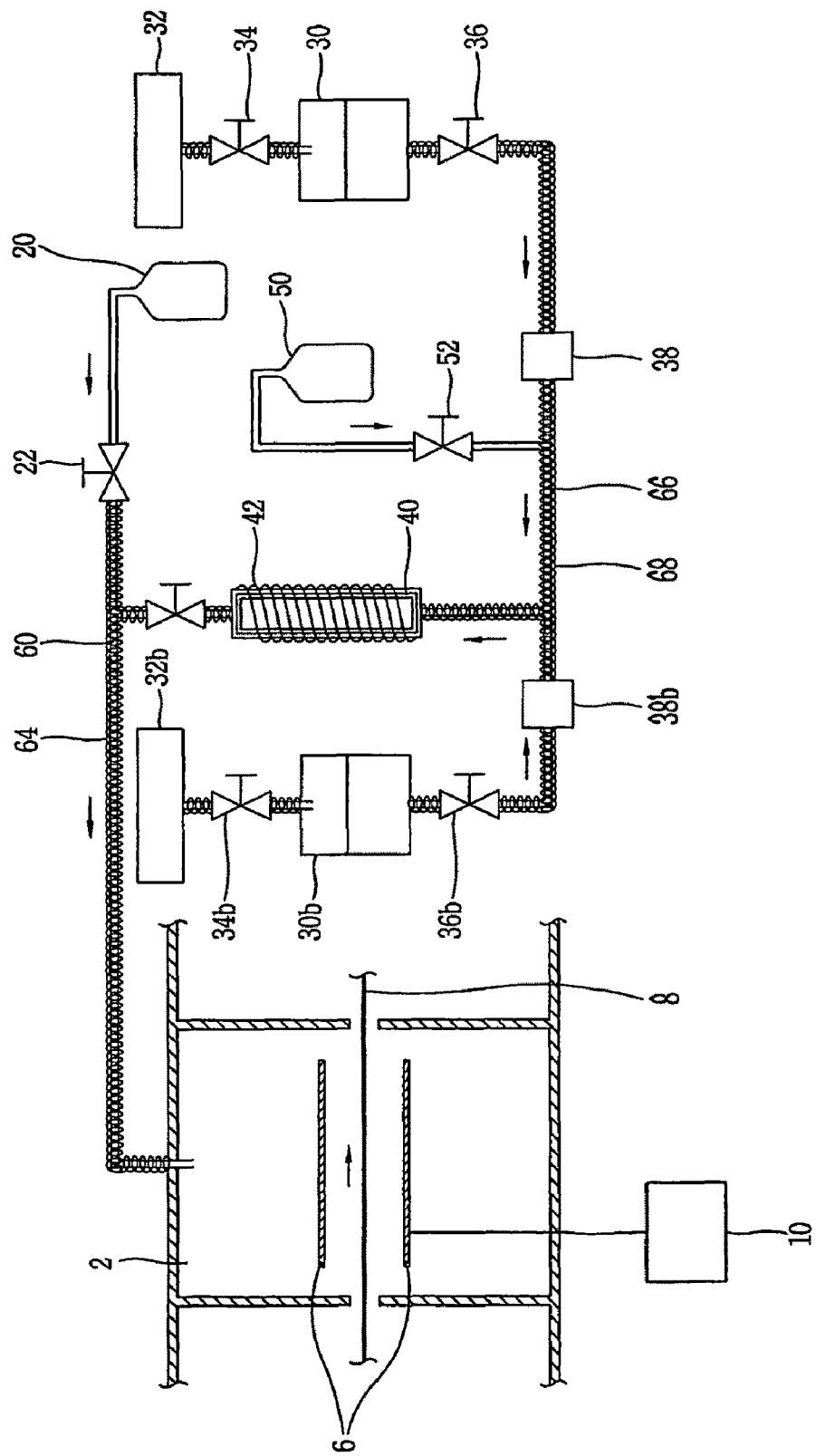
FIG. 1 is a concept view illustrating a device for continuously coating a ultra-hydrophilic and antibacterial Ti—Co thin film on a sheet-shaped metal substrate by using plasma in accordance with a first embodiment of the present invention.
Figure 2:
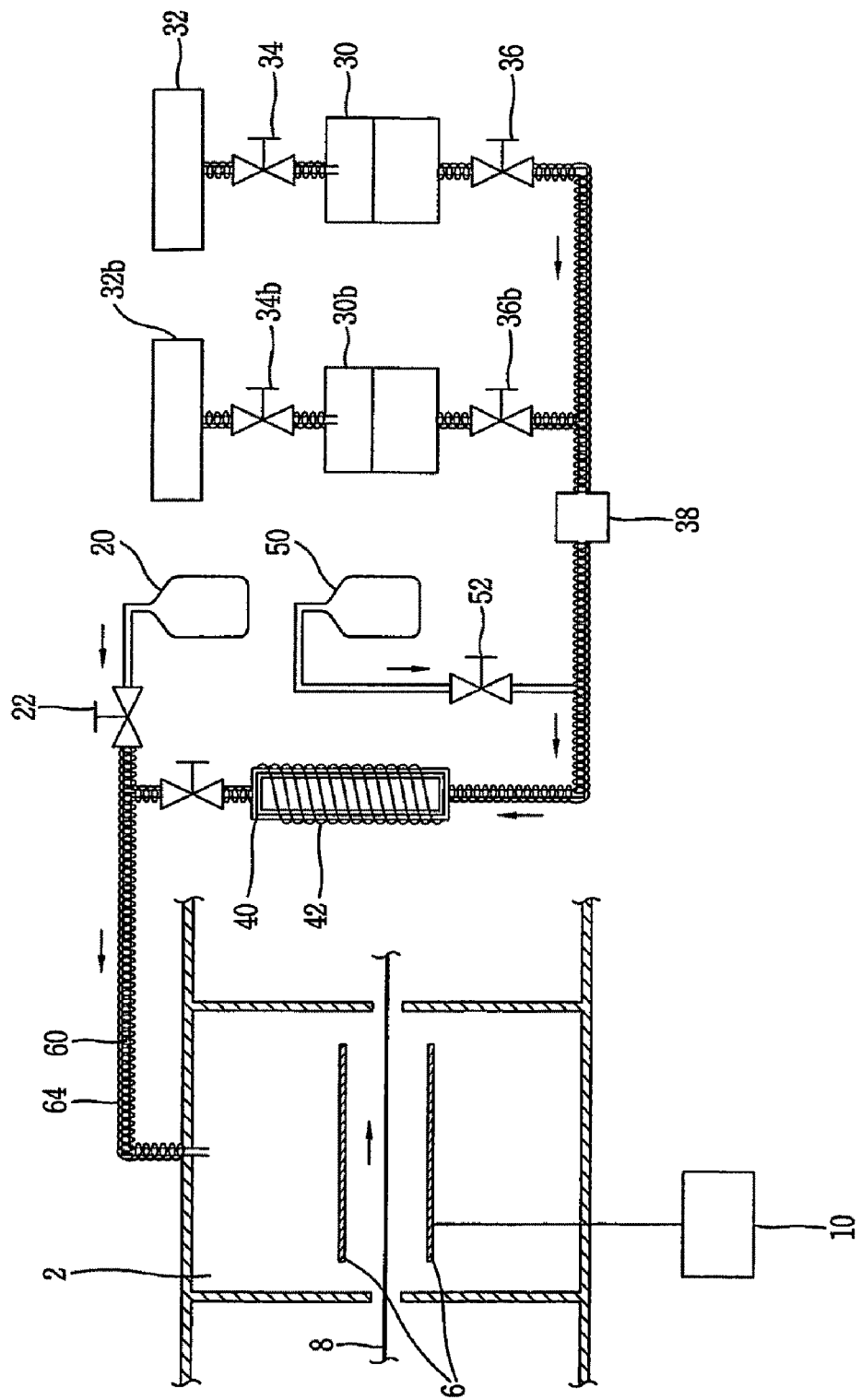
FIG. 2 is a concept view illustrating a device for continuously coating a ultra-hydrophilic and antibacterial Ti—Co thin film on a sheet-shaped metal substrate by using plasma in accordance with a second embodiment of the present invention.

FIGS. 1 and 2 are concept views respectively illustrating a plasma polymerization device for coating an ultra-hydrophilic and antibacterial Ti—(Ag, Cu and/or Co)—O—C group compound thin film on a sheet-shaped metal substrate in accordance with first and second embodiments of the present invention. A vacuum pump (not shown) for forming a vacuum inside a coating chamber 2 is connected to the coating chamber 2, and a metal sheet 8 is continuously supplied between electrodes 6 installed at the upper and lower portions or the right and left portions. Here, as shown in FIG. 1, the electrodes 6 are installed at the upper and lower portions of the metal sheet 8, and the metal sheet 8 is supplied in the horizontal direction. After the ultra-hydrophilic and antibacterial Ti—(Ag, Cu and/or Co)—O—C group compound thin film is continuously coated on both surfaces of the metal sheet 8 by plasma generated between the electrodes 6, the metal sheet 8 is discharged from the coating chamber 2. Power 10 is applied to the electrodes 6.

Preferably, a reactive gas cylinder 20 containing reactive gas that can form air or $O_2$ injects the reactive gas to the coating chamber 2 through a valve 22.

Here, constitutional elements corresponding to the Ag, Cu or Co precursor coated to obtain the antibacterial property are indicated by adding 'b' to reference numerals.

A liquid-phase Ti precursor that is liquid-phase titanium tetraisopropoxide [$Ti(OC_3H_7)_4$] and a liquid-phase Ag, Cu or Co precursor contained in containing vessels 30 and 30b pressurized by pressurizers 32 and 32b are injected into the same bubbler 40 through liquid-phase mass flow controllers (MFCs) 38 and 38b due to pressure differences. A gas-phase Ti precursor and a gas-phase Ag, Cu or Co precursor bubbled by the bubbler 40 are injected into the coating member 2.

Preferably, carrier gas that can form He, Ar or $N_2$ is injected through a tube between the liquid-phase MFC 38 and the bubbler 40, for helping the gas-phase Ti precursor to be injected into the coating chamber 2. The carrier gas is contained in a carrier gas cylinder 50 and injected into the tube through a valve 52. A heater coil 42 is coiled around the bubbler 40 to heat and bubble the liquid-phase Ti precursor and the liquid-phase Ag, Cu or Co precursor (80 to 120° C.). Preferably, the injection ratio of the reactive gas and the carrier gas injected into the coating chamber 2 is 3:1, and the injection ratio of the carrier gas and the gas-phase precursor is 1:3.

Preferably, the injection ratio of the carrier gas and the gas-phase Ag, Cu or Co precursor injected into the coating chamber 2 is 1:1.

Here, the reactive gas, the gas-phase Ti precursor or the gas-phase Ag, Cu or Co precursor and the carrier gas can be combined outside the coating chamber 2 and injected into the coating chamber 2 through a tube 60 as shown in FIG. 1, or can be injected into the coating chamber 2 through different tubes and combined inside the coating chamber 2 through one tube. Still referring to FIG. 1, the combining tube 60 is connected through one-side hole of the coating chamber 2. Preferably, the mixed gas injected through the tube 60 is discharged in the up/down direction of the coated metal sheet 8.

The gas-phase Ti precursor or the gas-phase Ag, Cu or Co precursor is condensed at a low temperature. When the tube 60 is maintained at a normal temperature, the gas-phase Ti precursor or the gas-phase Ag, Cu or Co precursor is condensed on the inner wall of the tube 60. In order to prevent condensation of the gas-phase Ti precursor or the gas-phase Ag, Cu or Co precursor, a hot wire 64 is coiled around the outer wall of the tube 60 through which the gas-phase precursor gas flows, for maintaining a predetermined temperature (80 to 120° C.). A tube through which the liquid-phase Ti precursor or the liquid-phase Ag, Cu or Co precursor flows is also formed in the same manner. That is, a hot wire is coiled around the outer wall of the tube, for maintaining a predetermined temperature, thereby preventing the Ti precursor or the Ag, Cu or Co precursor from being condensed on the inner wall of the tube.

In accordance with the present invention, the ultra-hydrophilic and antibacterial Ti—(Ag, Cu and/or Co)—O—C group compound thin film is continuously coated on the metal sheet 8 continuously supplied to the coating chamber 2 by using the plasma, and the thin film coated metal sheet 8 is mechanically processed into a target shape, for example, a fin for an air conditioning heat exchanger.

The structures of FIGS. 1 and 2 are used according to how the liquid-phase Ag, Cu or Co precursor applied to give the antibacterial property to the thin film is injected to the bubbler 40 in regard to the liquid-phase Ti precursor. In the structure of FIG. 1, the MFC 38 for the liquid-phase Ti precursor and the MFC 38b for the liquid-phase Ag, Cu or Co precursor are individually formed. The liquid-phase precursors passing through the MFCs 38 and 38b are combined through different tubes, bubbled in the bubbler 40, and injected into the coating chamber 2. Otherwise, as shown in FIG. 2, the liquid-phase precursors can be injected into the bubbler 40 through one MFC 38.

It is presumed that one of the Ag, Cu and Co precursors is injected to the structures of FIGS. 1 and 2. However, it is also possible to inject more precursors. In this case, containing vessels and tubes for injecting the precursors are added. A plurality of precursors can be easily injected in the same principle by those skilled in the art.

In accordance with the present invention, the ultra-hydrophilic and antibacterial Ti—(Ag, Cu and/or Co)—O—C group compound thin film is continuously coated on the metal sheet 8 continuously supplied to the coating chamber 2 by using the plasma, and the thin film coated metal sheet 8 is mechanically processed into a target shape, for example, a fin for an air conditioning heat exchanger.

Figure 3:
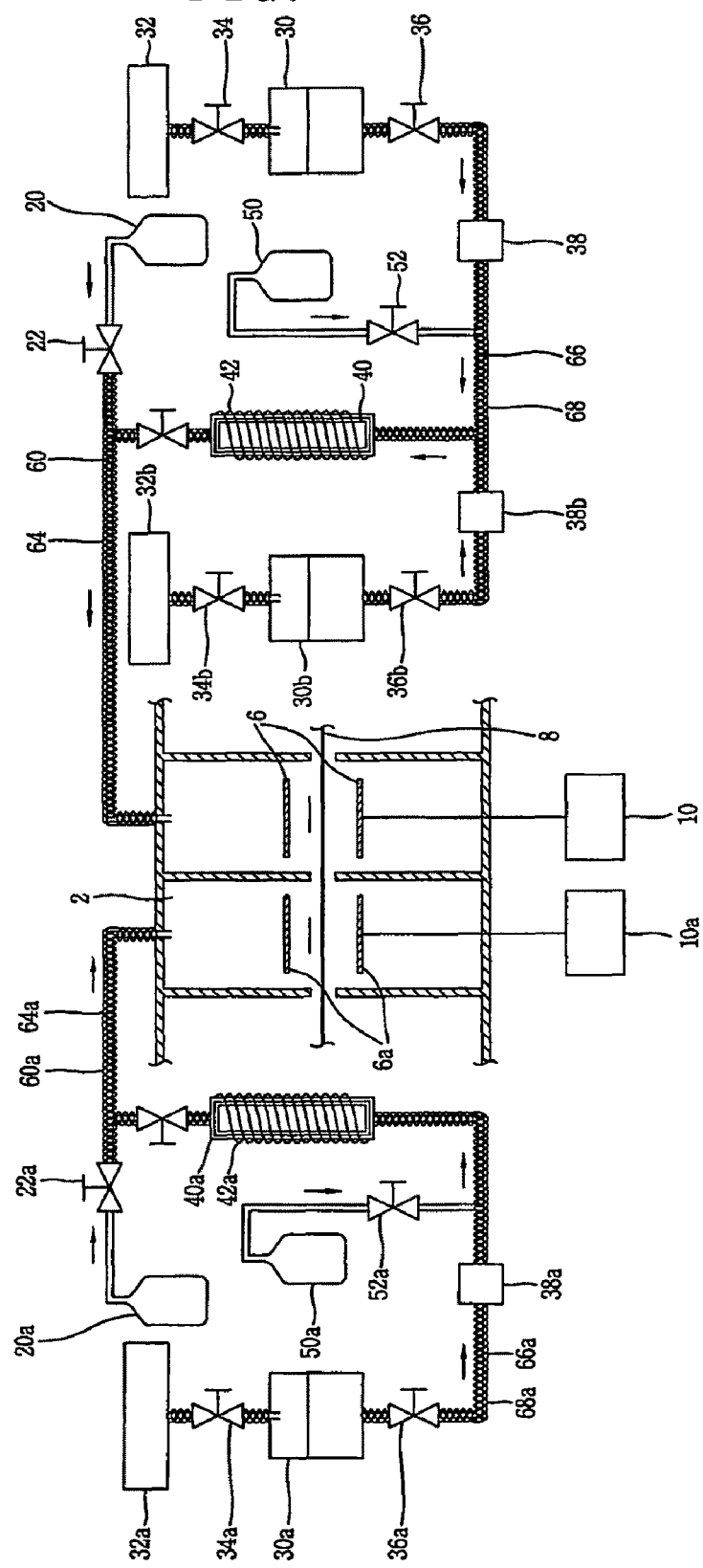
FIG. 3 is a concept view illustrating a device for continuously coating an anticorrosive thin film on a sheet-shaped metal substrate by using plasma, and continuously coating a ultra-hydrophilic and antibacterial compound thin film on the sheet-shaped metal substrate by using the plasma in accordance with a third embodiment of the present invention.

FIG. 3 is a concept view illustrating a plasma polymerization device for manufacturing a ultra-hydrophilic and antibacterial thin film coated metal sheet in accordance with a third embodiment of the present invention. The plasma polymerization device of FIG. 3 continuously coats an anticorrosive Si—O group compound thin film on both surfaces of a sheet-shaped metal substrate, and then continuously coats a ultra-hydrophilic Ti—(Ag, Cu and/or Co)—O—C group compound thin film on both surfaces of the sheet-shaped metal substrate coated with the anticorrosive thin film. Here, the plasma polymerization device coats the anticorrosive thin film on the sheet-shaped metal substrate, and then coats the ultra-hydrophilic and antibacterial thin film thereon. The plasma polymerization device of FIG. 3 is identical to the above-described plasma polymerization devices, except for sequentially coating the anticorrosive thin film and the ultra-hydrophilic and antibacterial thin film by using two coating chambers 2. Same drawing reference numerals are used for the same elements even in different drawings. The structure for forming the anticorrosive thin film is similar to the structure for forming the ultra-hydrophilic and antibacterial thin film, and thus explained by adding 'a' to the corresponding reference numerals.

Vacuum pumps (not shown) for forming a vacuum inside the coating chambers 2 are connected to the coating chambers 2. As shown in FIG. 3, a metal sheet 8 is continuously supplied between electrodes 6 and 6a installed at the upper and lower portions. After an anticorrosive thin film and an ultra-hydrophilic and antibacterial thin film are continuously sequentially coated on both surfaces of the metal sheet 8 by plasma generated between the electrodes 6 and 6a, the metal sheet 8 is discharged from the coating chambers 2. Power 10 and 10a is applied to the electrodes 6 and 6a.

Preferably, reactive gas cylinders 20 and 20a containing reactive gas that can form air or $O_2$ inject the reactive gas to the coating chambers 2 through valves 22 and 22a.

In addition, a liquid-phase Ti precursor that is liquid-phase titanium tetraisopropoxide [$Ti(OC_3H_7)_4$], a liquid-phase Ag, Cu or Co precursor and the liquid-phase Si precursor that is liquid-phase HMDSO contained in containing vessels 30 and 30a pressurized by pressurizers 32 and 32a are injected into bubblers 40 and 40a through liquid-phase MFCs 38 and 38a due to pressure differences. A gas-phase Ti precursor, a gas-phase Ag, Cu or Co precursor and a gas-phase Si precursor bubbled by the bubblers 40 and 40*a* are injected into the coating members 2. Preferably, carrier gas that can form He, Ar or $N_2$ is injected through tubes between the liquid-phase MFCs 38 and 38*a* and the bubblers 40 and 40*a*, for helping the gas-phase Ti precursor, the gas-phase Si precursor and the gas-phase Ag, Cu or Co precursor to be injected into the coating chambers 2. The carrier gas is contained in carrier gas cylinders 50 and 50*a* and injected into the tubes through valves 52 and 52*a*. Heater coils 42 and 42*a* are coiled around the bubblers 40 and 40*a* to heat and bubble the liquid-phase Ti precursor, the liquid-phase Ag, Cu or Co precursor and the liquid-phase Si precursor (80 to 120° C.).

Preferably, the injection ratio of the gas injected into the coating chamber 2 to coat the anticorrosive thin film satisfies reactive gas:carrier gas=1:10 to 1:20, and carrier gas:Si precursor=1:1 to 1:2.

Here, the reactive gas, the gas-phase Ti precursor, the gas-phase Ag, Cu or Co precursor, the gas-phase Si precursor and the carrier gas can be combined outside the coating chambers 2 and injected into the coating chambers 2 through each of tubes 60 and 60*a* as shown in FIG. 3, or can be injected into the coating chambers 2 through different tubes and combined inside the coating chambers 2 through one tube. Still referring to FIG. 3, the combining tubes 60 and 60*a* are connected through one-side holes of the coating chambers 2. Preferably, the mixed gas injected through the tubes 60 and 60*a* is discharged in the up/down direction of the coated metal sheet 8.

The gas-phase Ti precursor or the gas-phase Ag, Cu or Co precursor and the gas-phase Si precursor are condensed at a low temperature. When the tubes 60 and 60*a* are maintained at a normal temperature, the gas-phase Ti precursor or the gas-phase Si precursor is condensed on the inner walls of the tubes 60 and 60*b*. In order to prevent condensation of the gas-phase Ti precursor or the gas-phase Si precursor, hot wires 64 and 64*a* are coiled around the outer walls of the tubes 60 and 60*a* through which the gas-phase precursor gas flows, for maintaining a predetermined temperature (80 to 120° C.). Tubes 66 and 66*a* through which the liquid-phase Ti precursor or the liquid-phase Si precursor flows is also formed in the same manner. That is, hot wires 68 and 68*a* are coiled around the outer walls of the tubes 66 and 66*a*, for maintaining a predetermined temperature, thereby preventing the Ti precursor, the Ag, Cu or Co precursor and the Si precursor from being condensed on the inner walls of the tubes 66 and 66*a*.

In this embodiment, the ultra-hydrophilic and antibacterial thin film is coated directly after the anticorrosive thin film is coated on the metal sheet. If necessary, the ultra-hydrophilic and antibacterial thin film can be coated according to a different process after the anticorrosive thin film is coated on the metal sheet (namely, after the sheet is unwound, coated with the anticorrosive thin film and wound in a roll shape). In this case, one chamber can be used. In addition, an intermediate medium (for cooling) can be disposed between chambers, instead of consecutively installing the chambers.

In accordance with the present invention, the anticorrosive Si—O group compound thin film is continuously coated on the metal sheet 8 continuously supplied to the coating chambers 2 by using the plasma, and the ultra-hydrophilic and antibacterial thin film is continuously coated on the metal sheet 8 coated with the anticorrosive thin film by using the plasma. The thin film coated metal sheet 8 is mechanically processed into a target shape, for example, a fin for an air conditioning heat exchanger.

The ultra-hydrophilic and antibacterial thin film coated metal sheet can be manufactured by using the plasma polymerization device. As mentioned above, the metal sheet is mechanically processed into the fin for the heat exchanger, and physical and surface properties thereof are measured and explained in the following examples. It must be recognized that the scope of the present invention is not restricted by the following examples but claims recited below.

Examples

Preparation of Plasma Coating Film

After 0.001 to 0.5 Torr of vacuum ($10^{-3}$ Torr) was formed in the coating chamber 2 by using the vacuum pump, the metal sheet 8 was connected to an anode and maintained at a predetermined distance (30 to 150 mm) from the electrodes 6, and the heater coil 42 of the bubbler 40 was electrically heated (80 to 120° C.) to bubble the liquid-phase precursor. The hot wires 64 and 68 coiled around the outer walls of the tubes 60 and 66 were electrically heated (80 to 120° C.) to prevent the gas-phase precursor from being condensed on the inner walls of the tubes 60 and 66. The gas-phase precursor gas, the carrier gas and the reactive gas were injected into the coating chamber 2 through the tube, and discharged in the up/down direction of the metal sheet 8. When a target vacuum degree was obtained by the injected gas, power was turned on to generate the plasma by the mixed gas between the electrodes 6 consecutively formed in the flow direction of the metal sheet 8 in regard to the tube 60. Accordingly, an ultra-hydrophilic Ti—O—C group compound thin film, Ti—Si—O—C group compound thin film, Ti—Co—O—C group compound thin film and Ti—Si—Co—O—C group compound thin film were coated on both surfaces of the metal sheet 8.

In the plasma treatment, the current ranged from 0.1 to 0.5 A, the flow rate of the carrier gas that was He, Ar or $N_2$ ranged from 30 to 100 sccm, the flow rate of the reactive gas that was $O_2$ or air ranged from 30 to 100 sccm, and the vacuum degree inside the chamber 2 ranged from 0.2 to 0.5 Torr.

Analysis of Composition and Thickness of Coated Thin Film

Figure 4:
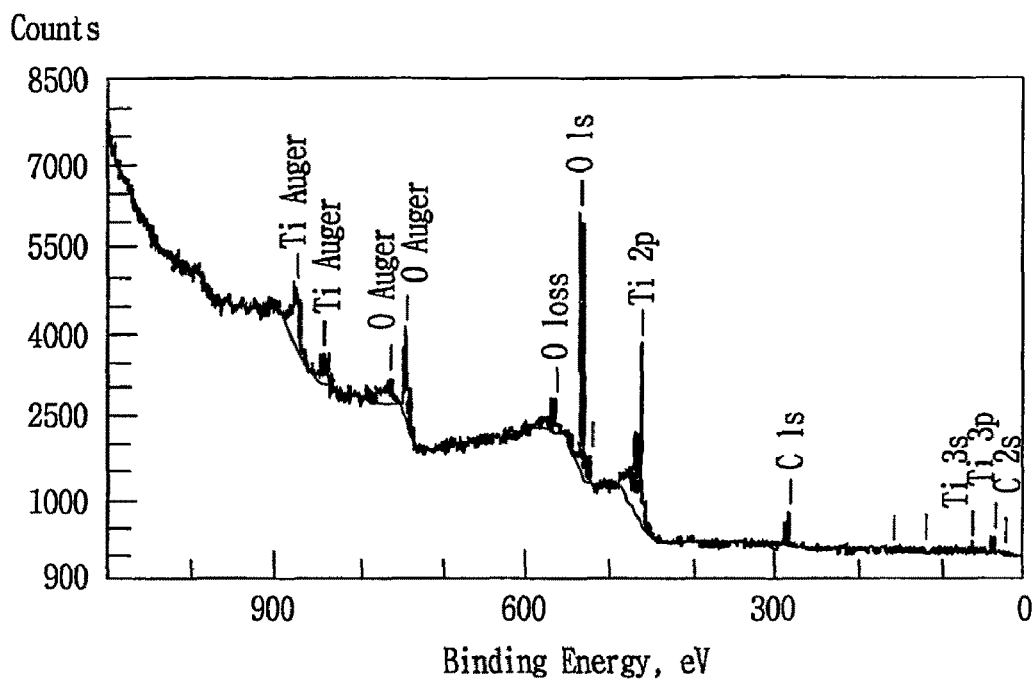
FIG. 4 is a graph showing XPS data for analyzing surface composition of a metal sheet coated with anticorrosive and ultra-hydrophilic thin films in accordance with the present invention.
Figure 5:
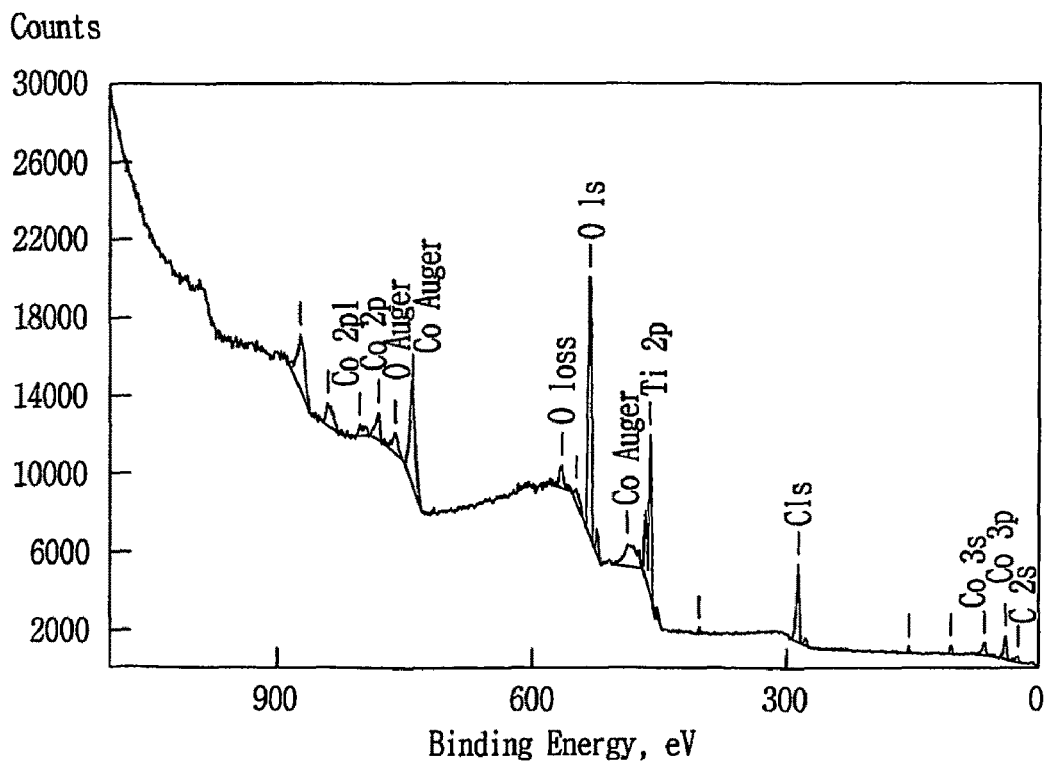
FIG. 5 is a graph showing XPS data for analyzing surface composition of a metal sheet coated with a ultra-hydrophilic and antibacterial thin film in accordance with the present invention.

The composition of the processed thin film sample was analyzed according to X-ray photoelectric spectroscopy (XPS) for analogizing surface composition by measuring molecular specific absorption and emission wavelengths by using X-rays, and the thickness thereof was analyzed according to atomic emission spectrometry (AES) for analyzing composition by depth by performing sputtering at a fixed speed. FIGS. 4 and 5 show the analysis results.

FIG. 4 is a graph showing XPS data when a Ti compound thin film was formed after an anticorrosive HMDSO thin film. 19.4 atomic % of C, 58.3 atomic % of O, 2.5 atomic % of Si and 19.8 atomic % of Ti were analyzed. That is, the compound thin film was a Ti—Si—O—C group compound thin film.

FIG. 5 is a graph showing XPS data when a thin film containing Co was formed. 18.3 atomic % of C, 59.1 atomic % of O, 18.9 atomic % of Ti and 3.7 atomic % of Co were analyzed. The compound thin film was a Ti—Co—O—C group compound thin film.

Although not illustrated, when only an ultra-hydrophilic compound thin film was coated, a Ti—O—C group compound thin film was obtained, and when a thin film containing Co was formed after an anticorrosive thin film to give the antibacterial property, a Ti—Si—Co—O—C group compound thin film was obtained.

In accordance with the analysis results, although slightly varied upon the conditions, the Ti compound thin film commonly contained 15 to 22 atomic % of Ti, 45 to 65 atomic % of O, 20 to 25 atomic % of C and/or H, 20 to 25 atomic % of Si, and 3 to 10 atomic % of Co. As described above, when the anticorrosive film was coated earlier, Si was analyzed, and when Ag, Cu or Co was coated to give the antibacterial property, Ag, Cu or Co was analyzed.

The total thickness of the anticorrosive thin film and the ultra-hydrophilic and antibacterial thin film coated on the surfaces of the metal sheet ranged from 1 to 200 nm according to AES data that analyzed composition by depth by performing sputtering at a fixed speed.

Figure 6A:
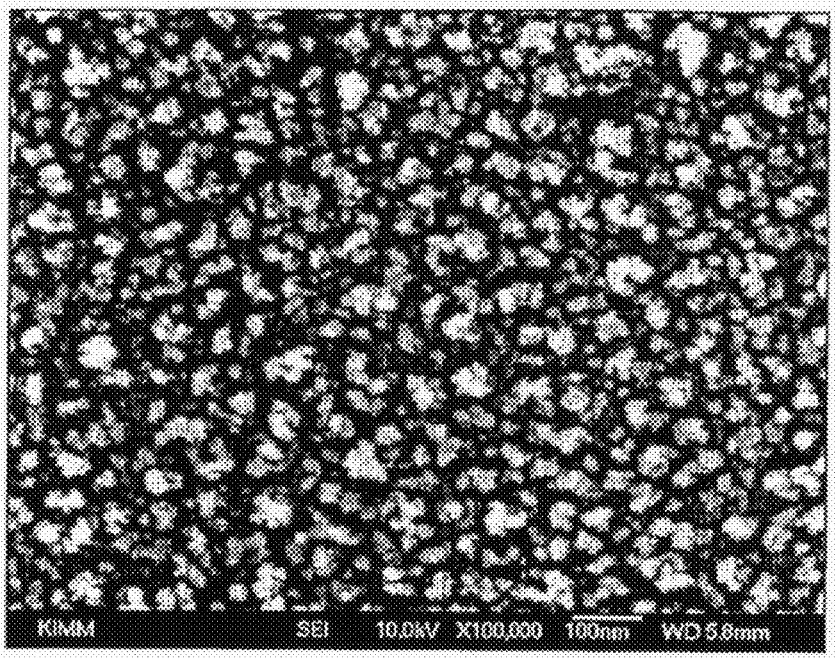
FIGS. 6a and 6b are SEM photographs showing microstructures of a coated Ti compound thin film and a coated Ti—Co compound thin film in accordance with the present invention.
Figure 6B:
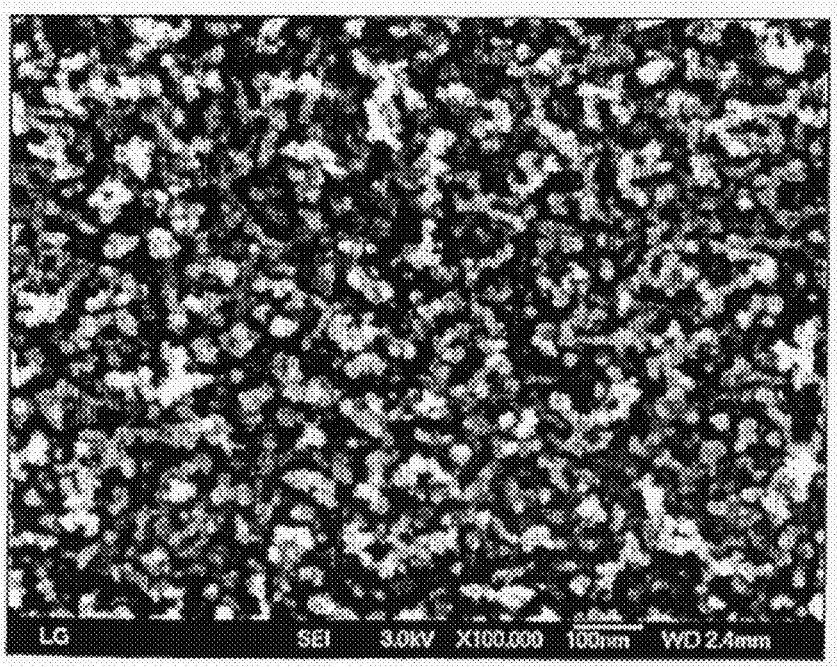

FIGS. 6a and 6b are SEM photographs showing the Ti—O—C group compound thin film and the Ti—Co—O—C group compound thin film in accordance with the present invention. In both cases, tight thin films were obtained.

Evaluation of Corrosion Resistance of Thin Film

Corrosion resistance was evaluated according to a salt spray test based on KS D9502 that was a method for evaluating corrosion resistance of metal materials, or metal materials using plating, organic coating films and inorganic coating films. The salt had a concentration of 5±1% and a temperature of 35±2° C. The corrosion resistance was evaluated on the basis of a pitting number observed with the naked eye.

TABLE 1

Evaluation of corrosion resistance by salt spray test

| Classifications | Bare Al | Conventional PCM | Present invention Ti—O—C group thin film | Present invention Ti—Si—O—C group thin film |
|---|---|---|---|---|
| 15 days after salt spray | Whole surface corroded | 10 | 2 | 0 |
| 30 days after salt spray | Whole surface corroded | 120 | 40 | 10 |
| Evaluation | Bad | Good | Very good | Very good |

As shown in Table 1, the non-coated Bare Al sheet showed the whole surface corrosion under the salt spray condition, namely, very low corrosion resistance, and the conventional PCM using wet coating had some corrosion pittings, namely relatively good corrosion resistance. In accordance with the present invention, the aluminum sheet coated with the Ti compound thin film had very excellent corrosion resistance. In the case that the HMDSO thin film was formed and the Ti compound thin film was coated thereon, the thin film showed extremely high corrosion resistance.

Figure 7A:
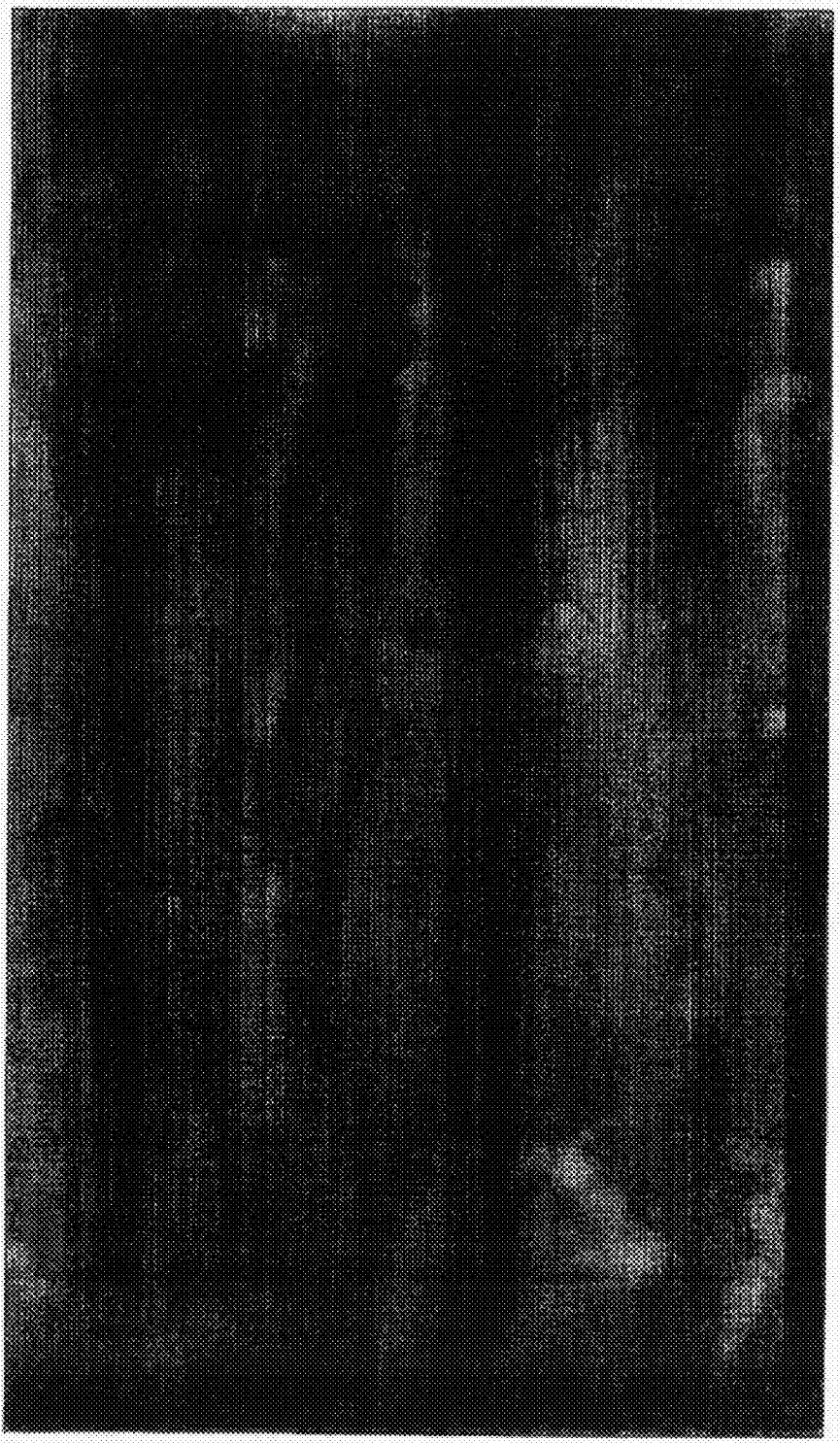
FIGS. 7a and 7b are photographs respectively showing surface states of the Bare Al sheet and the sheet coated with the anticorrosive and ultra-hydrophilic thin films after 15 days from the salt spray test.
Figure 7B:
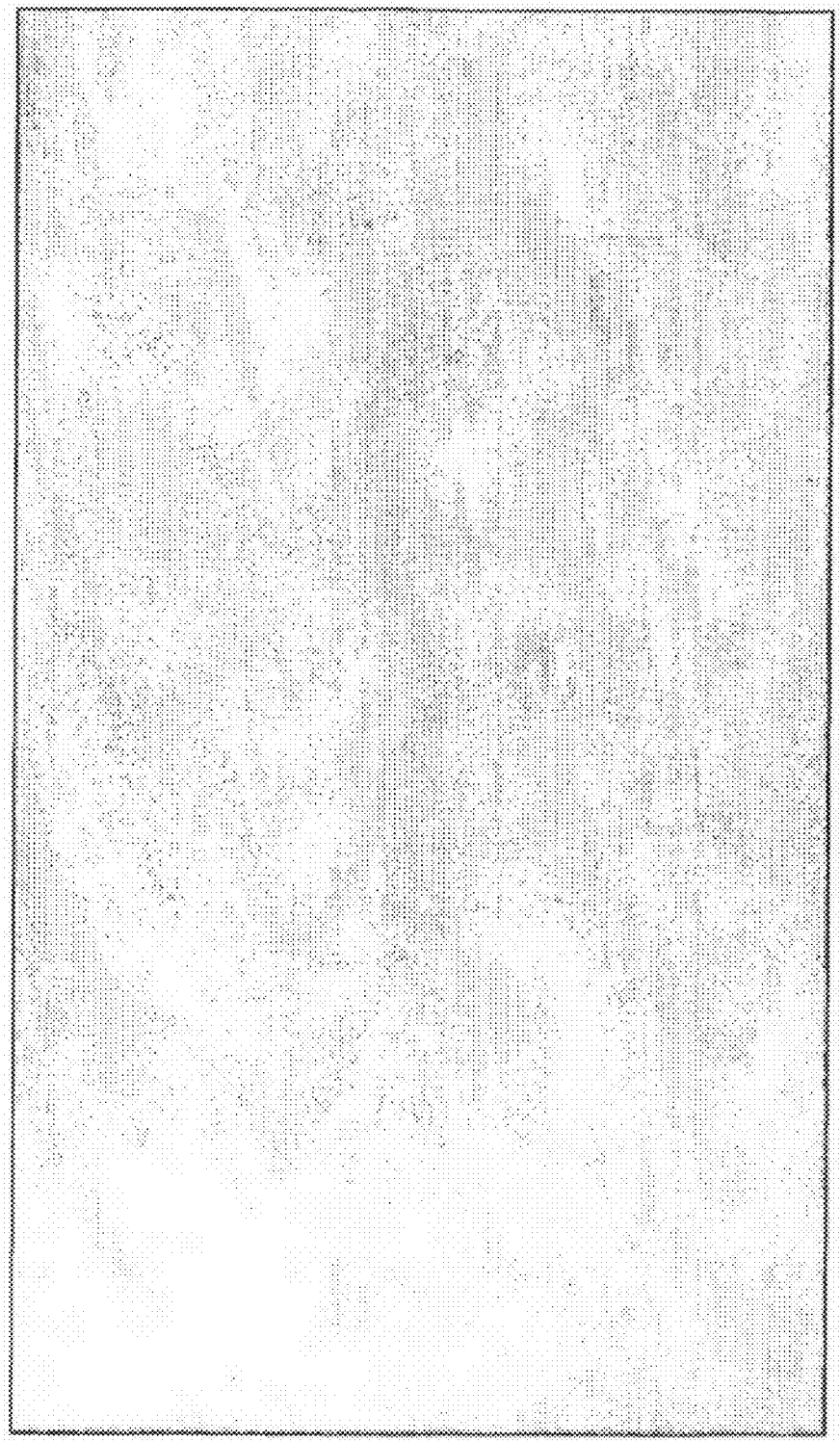

FIGS. 7a and 7b are photographs respectively showing surface states of the Bare Al sheet and the sheet coated with the HMDSO+Ti compound thin film after 15 days from the salt spray test. As illustrated in FIGS. 7a and 7b, the Bare Al sheet had the whole surface corrosion, but the thin film coated sheet had only 10 or less pittings, namely, extremely excellent corrosion resistance.

Hydrophilic and Aging Properties of Thin Film

Figure 8A:
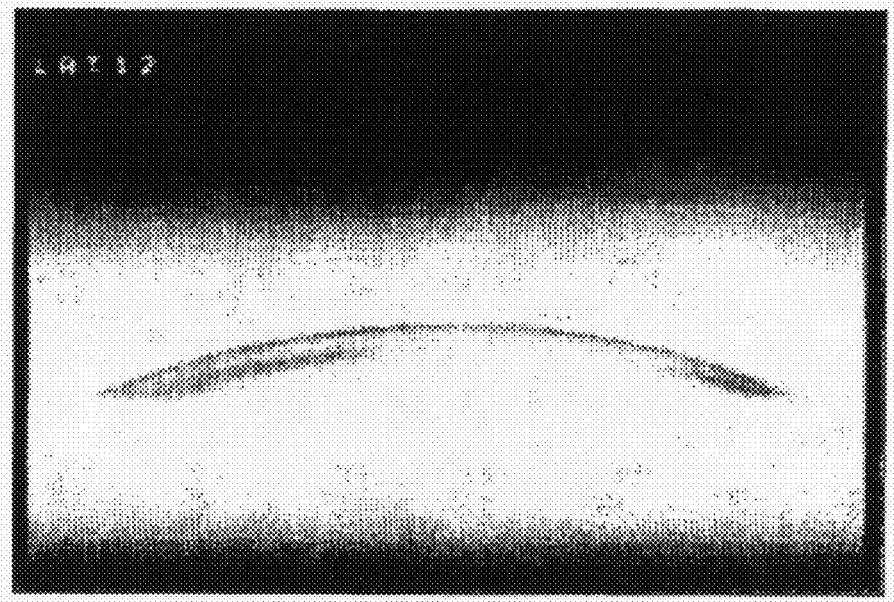
FIGS. 8a and 8b are photographs respectively showing dispersion of droplets when the surface is hydrophilic (FIG. 8a) and when the surface is hydrophobic (FIG. 8b) in a surface hydrophilicity/hydrophobicity test in accordance with the present invention.
Figure 8B:
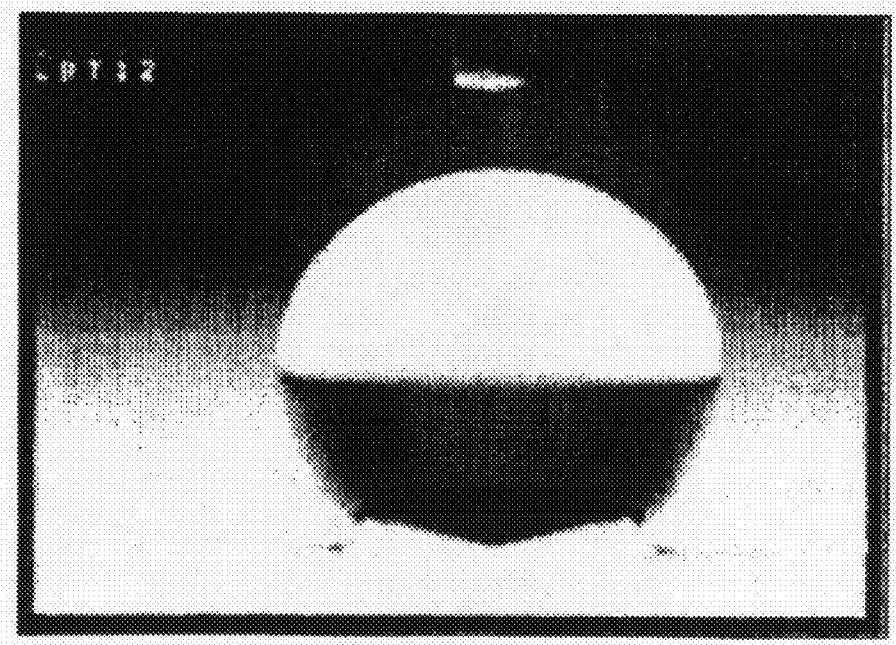

The hydrophilic performance was evaluated by dropping a fixed quantity of droplets (0.1 cc) from a height of 10 mm, and measuring a size of droplets on the surface of the sample. When the surface of the film was hydrophilic, the size of the droplets increased due to high dispersion, and when the surface of the film was hydrophobic, the size of the droplets decreased due to low dispersion. FIG. 8a shows the droplet formed on the hydrophilic surface. The size of the droplet ranged from 9 to 11 mm. FIG. 8b shows the droplet formed on the hydrophobic surface. The size of the droplet ranged from 2 to 3 mm.

In order to evaluate the hydrophilic aging property, the samples were cyclically put into distilled water for 10 minutes and dried for 10 minutes. The hydrophilic performance of the initial samples was compared with that of the samples obtained after 300 cycles.

Figure 9:
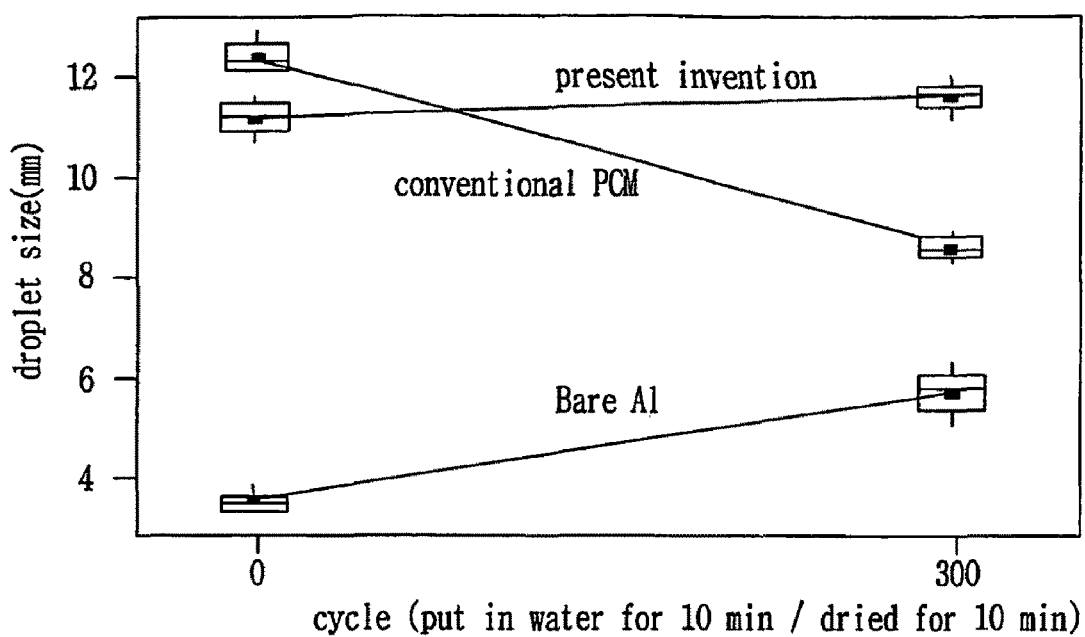
FIG. 9 is a graph showing aging properties of the Bare Al sheet, the conventional PCM sheet and the sheet coated with the Ti compound thin film of the present invention.

FIG. 9 is a graph showing the above test results. The hydrophilic performance of the thin film of the present invention processed by the plasma was not changed after 300 cycle accelerations. On the other hand, the conventional PCM had excellent initial hydrophilic performance. As a surfactant that was a hydrophilic agent was dissolved in water, the hydrophilic performance of the conventional PCM was deteriorated. That is, the conventional PCM was aged. The Bare Al had a hydrophobic property at an initial stage. After accelerations, an $Al_2O_3$ layer was formed on the surface of the aluminum to slightly improve the hydrophilic performance.

Figure 10:
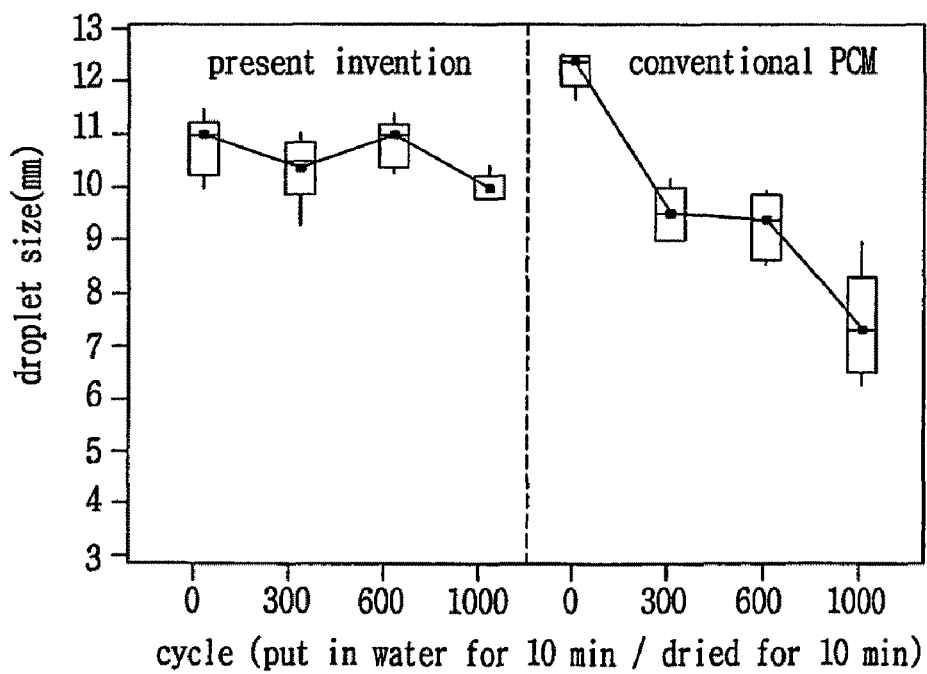
FIG. 10 is a graph showing aging properties of the sheet coated with the Ti compound thin film of the present invention and the conventional PCM sheet.

FIG. 10 is a graph showing 1000 cycle aging test results of the Ti compound thin film of the present invention and the conventional PCM thin film. The thin film of the present invention maintained the hydrophilic performance (at least 9 mm of droplets). On the other hand, the hydrophilic performance of the conventional PCM thin film was sharply deteriorated according to increase of cycles.

Antibacterial Property of Thin Film

In order to evaluate the antibacterial performance, the antibacterial rates of *staphylococcus aureus* and *escherichia coli* were measured according to a film sticking method based on standard FC-TM-20-2003.

Figure 11:
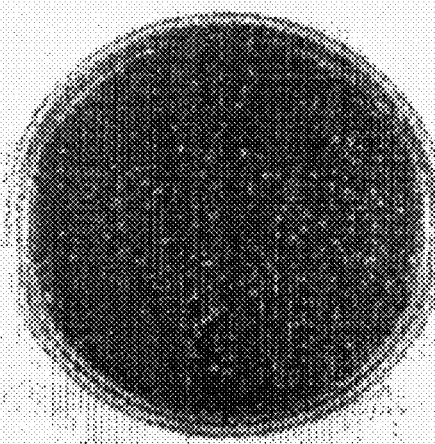
FIG. 11 is a film sticking test result showing an antibacterial property of the Ti—Co compound thin film to *staphylococcus aureus*.
Figure 11:
Figure 11:
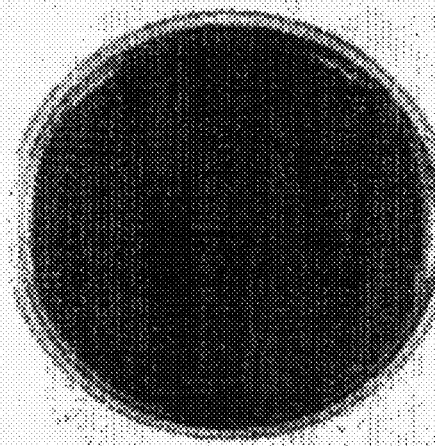
Figure 11:
Figure 12:
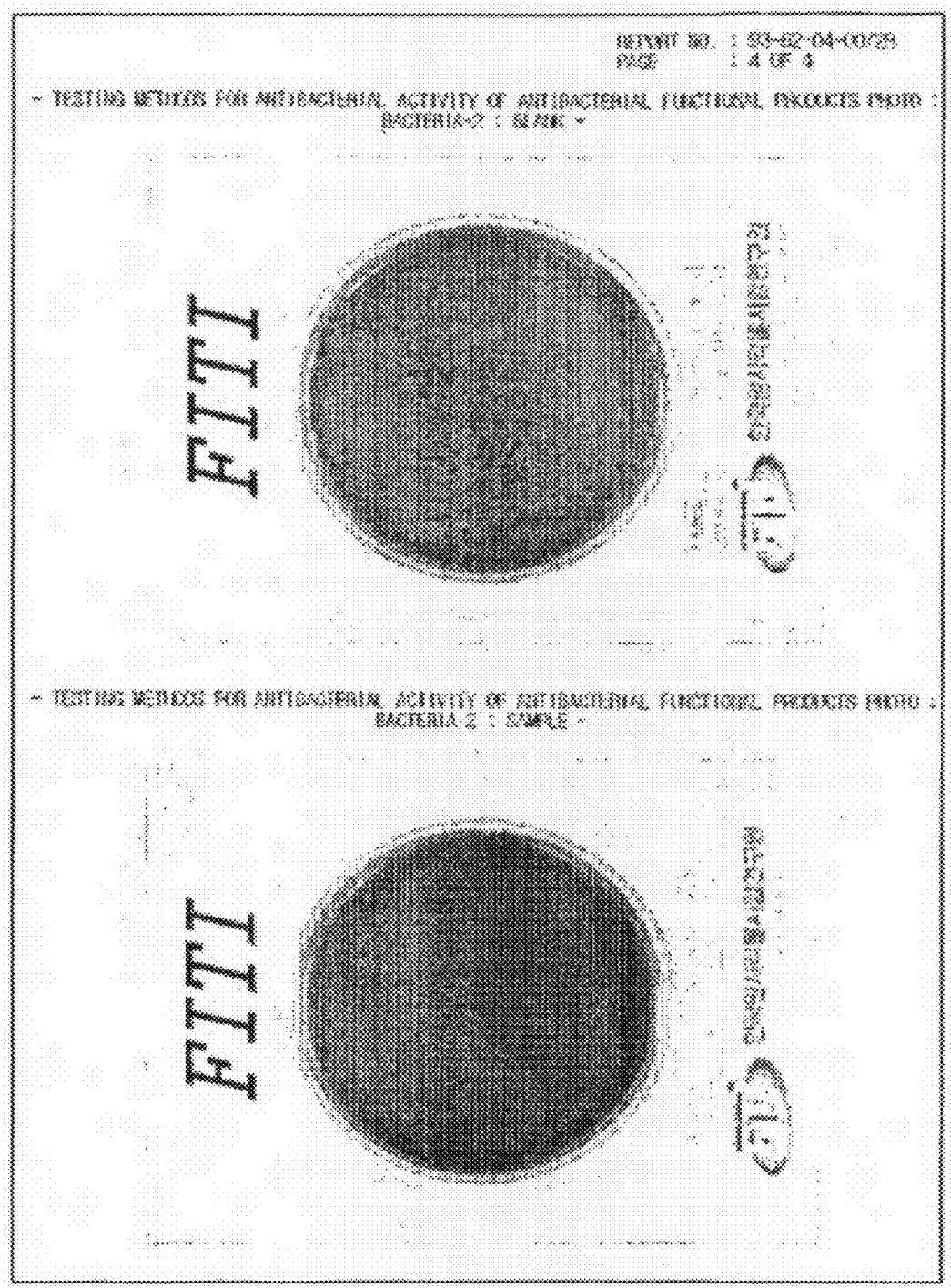
FIG. 12 is a film sticking test result showing an antibacterial property of the Ti—Co compound thin film to *escherichia coli*.

FIG. 11 shows the evaluation result of *staphylococcus aureus*, and FIG. 12 shows the evaluation result of *escherichia coli*. At the initial stage, the number of both *staphylococcus aureus* and *escherichia coli* of the film was $1.8 \times 10^5$. The film was stuck to the metal sheet coated with the Ti—Co—O—C group compound thin film. After 24 hours, the number of both *staphylococcus aureus* and *escherichia coli* was less than 10. That is, the antibacterial rate was extremely high, namely, over 99.9%. In the case that the thin film contained Cu or Ag instead of Co, the same result was obtained.

TABLE 2

Antibacterial performance test

| Classifications | staphylococcus aureus | escherichia coli | Evaluation | Remarks |
|---|---|---|---|---|
| Bare Al | 0.0% | 0.0% | No antibacterial property | |
| Bare Al | 26.0% | 25.0% | No antibacterial property | UV irradiation |
| $TiO_2$(Plasma) | 16.2% | 17.4% | No antibacterial property | |
| $TiO_2$(Plasma) | 99.9% | 99.8% | Antibacterial property | UV irradiation |
| $TiO_2$ + Cu (Plasma) | 98.1% | 99.8% | Antibacterial property | |

* UV condition: UV lamp (365 nm), distance 100 mm

Table 2 shows the antibacterial property of the thin films. The antibacterial performance was evaluated according to the film sticking method (standard FC-TM-20-2001). In the test, a Cu compound was employed as an antibacterial compound.

As shown in Table 2, when UV was irradiated to the Ti—O—C group compound thin film, an excellent antibacterial property was obtained. In addition, when the thin film contained Co, Cu or Ag, the very excellent antibacterial property was obtained without UV irradiation.

ADVANTAGEOUS EFFECTS

As discussed earlier, in accordance with the present invention, the air conditioning metal material coated with the thin films having excellent hydrophilic performance, aging property, corrosion resistance and antibacterial property can be easily produced on an industrial production scale.

Furthermore, the ultra-hydrophilic and/or antibacterial thin film can be uniformly formed on both surfaces of the sheet-shaped metal substrate. Also, the antibacterial thin film can be coated on the air conditioning metal material without requiring a special preprocess or postprocess such as UV treatment.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. An ultra-hydrophilic and antibacterial thin film coated metal product, which is manufactured by coating an ultra-hydrophilic and antibacterial Ti—(Ag, Cu and/or Co) group compound thin film on both surfaces of a substrate,
    wherein the compound thin film is one of a Ti—Ag—O group compound thin film, a Ti—Cu—O group compound thin film, a Ti—Co—O group compound thin film, and a Ti—Ag—Cu—Co—O group compound thin film, and
    wherein the compound thin film contains 15 to 22 atomic % of Ti, 3 to 10 atomic % of Ag, 3 to 10 atomic % of Cu, 3 to 10 atomic % of Co and 45 to 65 atomic % of O.

2. An ultra-hydrophilic and antibacterial thin film coated metal product, which is manufactured by coating an ultra-hydrophilic and antibacterial Ti—(Ag, Cu and/or Co) group compound thin film on both surfaces of a substrate,
    wherein the compound thin film is one of a Ti—Ag—O group compound thin film, a Ti—Cu—O group compound thin film, a Ti—Co—O group compound thin film, and a Ti—Ag—Cu—Co—O group compound thin film, and
    wherein the compound thin film further contains C and/or H.

3. The metal product of claim 2, wherein the compound thin film contains 15 to 22 atomic % of Ti, 3 to 10 atomic % of Ag and/or 3 to 10 atomic % of Cu, 3 to 10 atomic % of Co and 45 to 65 atomic % of O, and further contains 20 to 25 atomic % of C and/or 20 to 25 atomic % of H.

4. The metal product of claim 1, wherein an anticorrosive thin film is further coated between the substrate and the Ti—(Ag, Cu and/or Co) group compound thin film.

5. The metal product of claim 4, wherein the anticorrosive thin film is a Si—O group compound thin film.

6. The metal product of claim 5, wherein the anticorrosive thin film contains 20 to 25 atomic % of Si and 45 to 65 atomic % of O.

7. The metal product of claim 1, wherein the thin films are coated by using plasma.

8. The metal product of claim 7, wherein the total thickness of the thin films ranges from 1 to 200 nm.

9. The metal product of claim 8, wherein the metal substrate is an aluminum substrate.

10. The metal product of claim 9, wherein the thin film coated metal sheet is mechanically processed into a target shape.

11. An anticorrosive and antibacterial thin film coated metal product, which is manufactured by coating an anticorrosive and antibacterial Si—(Ag, Cu, Co)—O—(C)—(H) group compound thin film on the surface of a substrate, wherein the compound thin film contains 20~25 atomic % of Si, 45~65 atomic % of O, one or more selected among the group of 3~10 atomic % of Ag, and 3~10 atomic % of Cu and 3~10 atomic % of Co, and the reminder consisting of one or more among C and H, and unavoidable impurities.

* * * * *